United States Patent [19]

Stewart

[11] Patent Number: 5,078,091

[45] Date of Patent: * Jan. 7, 1992

[54] PARYLENE DEPOSITION CHAMBER AND METHOD OF USE

[76] Inventor: Jeffrey Stewart, 690-D Avenida Sevilla, Laguna Hills, Calif. 92653

[*] Notice: The portion of the term of this patent subsequent to Aug. 7, 2007 has been disclaimed.

[21] Appl. No.: 494,985

[22] Filed: Mar. 15, 1990

Related U.S. Application Data

[62] Division of Ser. No. 211,338, Jun. 23, 1988, Pat. No. 4,945,856.

[51] Int. Cl.$^5$ .............................................. C23C 16/00
[52] U.S. Cl. ..................................... 118/719; 118/715; 118/728; 118/730; 427/255.6
[58] Field of Search ................ 118/715, 728, 730, 719; 427/255.6

[56] References Cited

U.S. PATENT DOCUMENTS

| | | | |
|---|---|---|---|
| 3,288,728 | 11/1966 | Gorham | 260/2 |
| 3,300,332 | 1/1967 | Gorham et al. | 117/100 |
| 3,342,754 | 9/1967 | Gorham | 260/2 |
| 3,472,795 | 10/1969 | Titman et al. | 260/2 |
| 3,503,903 | 3/1970 | Shaw et al. | 260/2 |
| 3,600,216 | 8/1971 | Stewart | 117/72 |
| 3,719,166 | 3/1973 | Gereth | 118/730 |
| 3,753,773 | 8/1973 | Lee | 427/255.6 |
| 3,895,135 | 7/1975 | Hofer | 427/248 |
| 3,908,046 | 9/1975 | Fitzpatrick | 427/255.6 |
| 4,508,054 | 4/1985 | Baumberger et al. | 118/715 |
| 4,649,859 | 3/1987 | Wanlass | 118/715 |
| 4,683,143 | 7/1987 | Riley | 118/692 |
| 4,945,856 | 8/1990 | Stewart | 118/730 |

FOREIGN PATENT DOCUMENTS

| | | | |
|---|---|---|---|
| 11576 | 2/1978 | Japan | 156/611 |
| 58-166726 | 10/1983 | Japan | 156/345 |
| 59-74629 | 4/1984 | Japan | 156/345 |

OTHER PUBLICATIONS

Brochure—Union Carbide, re: Parylene deposition systems, 1979.

Primary Examiner—Richard Bueker
Attorney, Agent, or Firm—Stetina and Brunda

[57] ABSTRACT

Disclosed is an improved parylene deposition chamber wherein reactive monomer vapors enter the chamber tangentially so as to create a rotational flow of vapor within the interior of the chamber. A substrate support fixture is psoitioned within the chamber and rotated in a direction counter to the rotational flow of vapor. An annular space exists between the outer edge of the fixture and the inner wall of the chamber so as to allow the rotating vapor to descend freely within the chamber. Waste of parylene chemicals is minimized by eliminating the need for the positioning of baffles within the chamber.

2 Claims, 1 Drawing Sheet

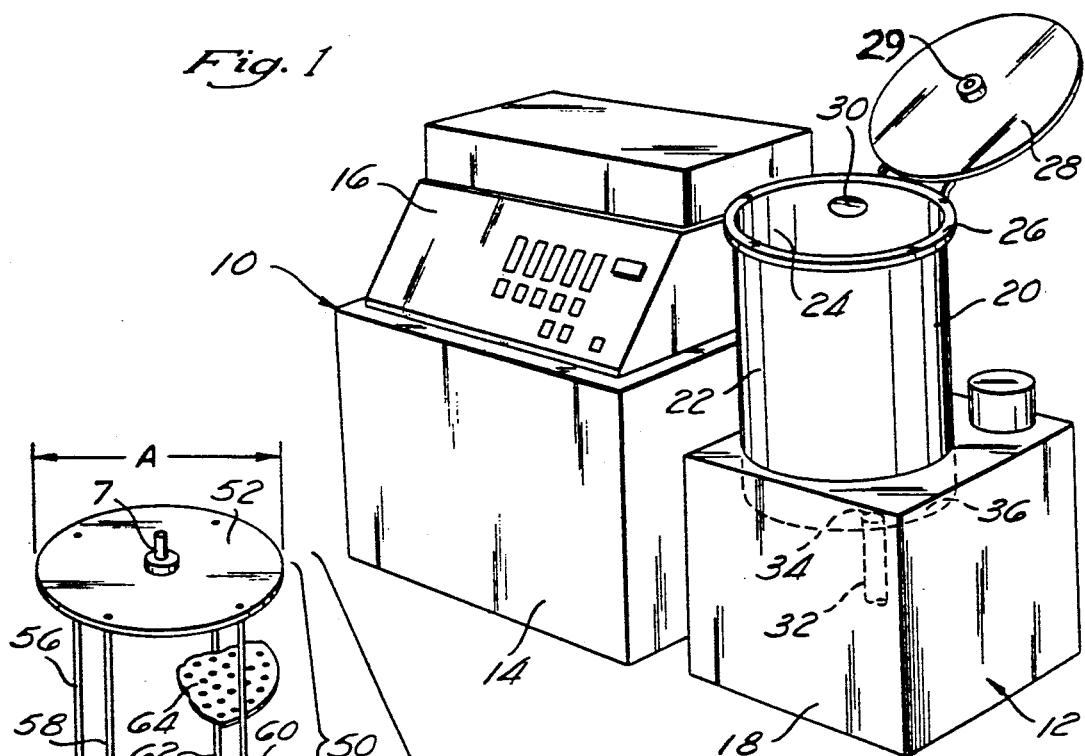
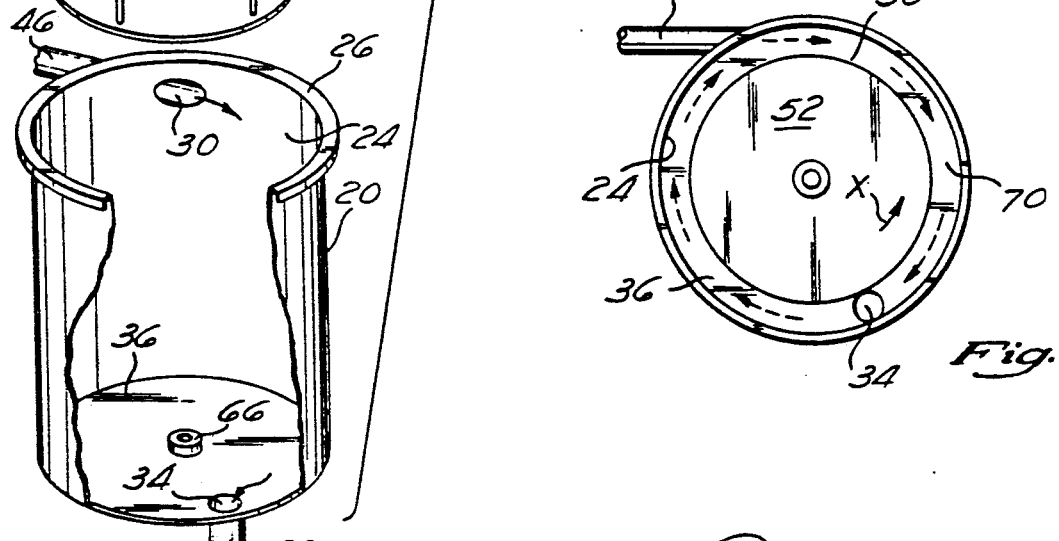
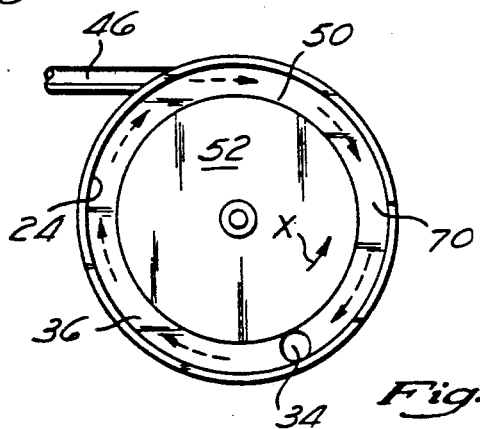
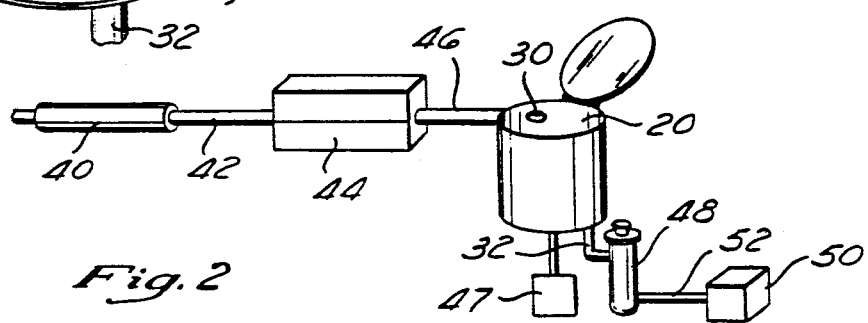

PARYLENE DEPOSITION CHAMBER AND METHOD OF USE

This application is a division of application Ser. No. 07/211,338, filed 6/23/88, now U.S. Pat. No. 4,945,856.

BACKGROUND OF THE INVENTION

This invention relates generally to an improved device for use in depositing condensation coatings on various substrates. More particularly, the invention relates to an improved modular deposition chamber for depositing para-xylylene polymers on electrical component parts and the like.

Para-xylylene polymers are employed as coatings for various electronic components due to their desirable physical and electrical properties. One advantage of poly-para-xylylene coatings is that extremely thin layers of such coatings are capable of exhibiting highly desirable physical and electrical properties. Because para-xylylene coatings are applied in very thin layers, heat tends to dissapate rapidly from the underlying components. Thus, the coated components cool down quickly and are less prone to temperature related degredation than similar components bearing other types of coatings.

In further contrast to conventional polymer coatings, para-xylylenes are generally not prepolymerized prior to application on the coatable substrate. This is so because the para-xylylene polymers are not given to simple extrusion, melting or molding as are many of the conventional thermoplastics. Additionally, because the para-xylylenes are generally insoluble in commonly used organic solvents, it is impractical to employ traditional solvent deposition techniques for applying poly-para-xylylene coatings.

Accordingly, in most commercial applications, para-xylylene polymers are deposited on desired substrates by a pyrolytic deposition process known specifically as the "parylene process." Such process begins with the vaporization of a cyclic di-para-xylylene dimer. The dimer is pyrolytically cleaved at temperatures of about 400° to 750° C. to form a reactive para-xylylene monomer vapor. Thereafter, the reactive monomer vapor is transferred to a deposition chamber wherein the desired substrates are located. Within the deposition chamber, the reactive monomer vapor condenses upon the desired substrates to form a para-xylylene polymer or co-polymer film.

Any monomer vapor which fails to condense within the deposition chamber is subsequently removed by a cold trap which is maintained at approximately −70° C.

The entire parylene process is generally carried out in a closed system under constant negative pressure. Such closed system may incorporate separate chambers for the (a) vaporization, (b) pyrolysis, and (c) deposition steps of the process, with such chambers being connected by way of appropriate plumbing or tubular connections.

A primary consideration in the parylene deposition process is the achievement of uniform coating thickness on the desired substrates. Unlike conventional polymer coating systems, the condensation deposition of parylene coatings is capable of depositing even ultrathin films without running or uneven areas resulting upon the substrates, provided that the monomer vapor is homogeneously and evenly distributed on the surface of the substrate. Thus, the design and functioning of the deposition chamber is critical to the achievement of uniform vapor distribution with resultant even coating deposition.

Another important consideration in the parylene deposition process is the minimization of waste. Currently, parylene raw materials may cost as much as $400 to $600 per pound. Thus, there exists substantial economic motivation to preserve and conserve the parylene materials during the coating process. One particular area in which a great deal of material is wasted is on the various internal structures of the prior art parylene deposition chambers. It must be appreciated that the condensation deposition of coatings is not substrate selective—i.e. the vapors have no way of seeking out only the desired substrate. Instead, the monomer vapor will condense and polymerize on any reduced temperature object with which it comes in contact. As a result, the entire inner surface, of the chamber, and all of the objects positioned therein will become covered with the parylene coating. Thus, the interior of the chamber and any existing hardware must be cleaned periodically to remove wasted parylene polymer.

The parylene deposition chambers employed in the prior art have generally provided less than optimal coating uniformity due to inferior distribution and homogeneity of the vapor within the deposition chamber. Also, because of the particular chamber design, the prior art deposition chambers are associated with a great deal of waste of the parylene chemicals.

At least one deposition chamber of the prior art employs a system of baffles, positioned adjacent a monomer vapor inlet line, so as to disperse the flow of vapor as it enters the deposition chamber. Such baffles are intended to uniformly distribute the monomer vapor throughout the interior of the deposition chamber thereby insuring uniform coating thickness on the desired substrates. In practical application, however, the various baffle designs employed in the prior art devices have failed to provide truly optimal vapor distribution within the chamber. As a result, less than optimal coating uniformity has been realized. Additionally, the presence of such baffles occupies otherwise useable space within the chamber and results in greater surface area within the chamber. Such increased surface area, accordingly, increases the amount of parylene waste due to the nonselective deposition of the polymer on the baffles as well as on the desired substrates.

Also, the deposition chambers of the prior art incorporate substrate holding racks which are supported only by one or more members extending from the bottoms thereof. The absence of any support member fixing the top end of such holding rack to the surrounding deposition chamber structures results in a rather unstable arrangement. Specifically, when relatively heavy parts are unevenly distributed on the upper shelves of the holding rack such rack may tend to lean against the surrounding baffles or deposition chamber walls.

SUMMARY OF THE INVENTION

The present invention overcomes the above described problems of the prior art, and others, by providing a condensation coating deposition chamber wherein uniformity of monomer vapor is maintained by inducting a rotary flow pattern within the chamber. Such rotary flow pattern obviates the need for baffles or other hardware elements thereby lessening the amount of polymer wasted during the process. Additionally, the parylene deposition chamber of the present invention provides greater versatility than the prior art devices because it is of modular design and, thus, easily detachable from the pyrolytic generating unit. Also, the deposition chamber of the present invention incorporates a substrate support or holding rack which is pivotally supported at its top end as well as its bottom end.

In accordance with the present invention, there is provided a condensation coating deposition chamber comprising a tank-like chamber body having a floor, a cylindrical wall, and an openable and closable lid. The monomer vapor enters tangentially near the top of the chamber through a tangentially connected monomer supply line. Such tangential entry of the monomer vapors results in a generally annular rotational flow of the vapors as they descend axially through the inner confines of the deposition chamber. Further in accordance with the invention a substrate support fixture is positioned centrally within the deposition chamber. As the flow of monomer vapors descends within the inner confines of the deposition chamber, the support fixture is rotated, preferably in a direction opposite the rotational flow of the entering vapors. Also, the fixture is specifically sized such that an annular space exists between the outer edges of the rack and the inner wall of the chamber. The provision of such annular space provides for an even flow of vapor around the fixture.

Further, in accordance with the invention, the substrate support fixture may comprise a multi-tiered rack having a plurality of substrate support shelves positioned horizontally therewithin. Each such substrate support shelve is provided with a multiplicity of perforations through which the monomer vapor may flow. Such perforations further enhance the degree of permeation and evenness of the vapor flow within the deposition chamber. The substrate support fixture is preferably pivotally connectable to the lid of the deposition chamber as well as the floor of the chamber, thereby providing uniform top to bottom support for the substrate support fixture so as to prevent lateral movement or shifting thereof and avoiding any resultant contact between the edges of the support fixture with the surrounding deposition chamber wall.

In accordance with an even further aspect of the invention, the deposition chamber of the present invention may be of modular design so as to be easily detachable from the attendant pyrolytic generation equipment. Such modular design permits the deposition chamber to be moved to a separate area for loading/unloading, cleaning and maintenance. Also, upon detachment of one modular chamber, another modular chamber may be immediately substituted in its place. Such flexibility provides for optimal utilization of a single pyrolytic vapor generating unit with multiple interchangable deposition chambers. Additionally, to facilitate movement of the modular sections, both the pyrolytic generator and deposition chamber modules are caster mounted to permit rapid and easy relocation as desired.

A principal object of the invention is to provide a condensation coating deposition chamber wherein improved vapor flow characteristics and design will result in uniform and even coating deposition, even at ultrathin film thicknesses.

Yet another object of the invention is to provide a condensation coating deposition chamber which will prevent waste of chemicals by avoiding the need for certain space occupying objects, such as baffles, which increase the surface area within the chamber.

Yet another object of the invention is to provide a condensation coating deposition chamber which is of modular design so as to be easily interchangeable and detachable from the attendant vapor generating unit.

A still further object of the invention, is to provide a substrate support fixture which is capable of being rotated within the deposition chamber so as to subject each substrate to uniform vapor concentrations and conditions.

Additional objects and advantages of the invention will become apparent to those skilled in the art upon reading and understanding of the following detailed description and the accompanying drawings.

BRIEF DESCRIPTION OF THE DRAWINGS

FIG. 1 is a perspective view of a parylene coating system which incorporates the modular parylene deposition chamber of the present invention.

FIG. 2 is a schematic diagram of the individual components of a parylene coating system which incorporates the parylene deposition chamber of the present invention.

FIG. 3 is an exploded view of a preferred parylene deposition chamber of the present invention.

FIG. 4 is a top plan view showing the rotational flow of vapor within a preferred parylene deposition chamber of the present invention.

DETAILED DESCRIPTION OF A PREFERRED EMBODIMENT

Referring now to the drawings wherein the showings are for purposes of illustrating a preferred embodiment of the invention and not for purposes of limiting its scope, FIG. 1 is a front view of the modular parylene deposition system of the present invention. Such system consists generally of a pyrolytic vapor generating module 10 and an attendant deposition chamber module 12. The exterior of the pyrolytic vapor generating module 10 includes a housing 14 and a control panel 16, as shown.

The base of the vapor generating module housing 14 incorporates a storage area or cabinet for storing spare parts, additional substrate fixtures, etc.

The pyrolytic generation module 10 houses conventional means, i.e. (a) a controller unit (not shown) which controls the temperatures, conditions, opening and closing of valves, etc., (b) a dimer vaporization chamber (not shown) and the pyrolysis chamber (not shown).

The deposition chamber module 12 comprises a base cabinet 18 and a deposition chamber 20. The base cabinet, 18 is sized and configured to house an attendant vacuum pump (not shown) and cold trap (not shown), in addition to acting as a support base for the deposition chamber 20. The deposition chamber 20 comprises a generally cylindrical tank having an outer wall 22, and inner wall 24, and a peripheral lip 26 about the upper rim thereof. A hinged lid 28 is attached to the chamber so as to be pivotally moveable between an "open" and a "closed" position. It will be appreciated that when the lid 28 is closed, it will form a vapor tight seal with the lip 26 so as to prevent the escape of vapors from the deposition chamber. In this preferred embodiment, the vapor tight seal is accomplished through the positioning of an appropriately sized "o" ring about the chamber lip 26 and/or corresponding rim of the chamber lid 28.

A vapor inlet line 46 enters the chamber 20 tangentially through an inlet port 30 formed near the top of the chamber. The vapor outlet line 32 exits through an outlet port 34 located in the floor 36 of the chamber 20 which is preferably disposed at approximately a 180 degree offset from the inlet port 30. Such vapor outlet line is subsequently connected to a cold trap (not shown) and a vacuum pump (also not shown) whereby negative pressure is maintained on the entire system.

The overall pyrolitic coating method of the present invention may be appreciated by referring specifically to the schematic diagram of FIG. 2. Vaporization chamber 40 is connected to a pyrolysis chamber 44 by way of a pipe 42. Thus, the vaporization chamber 40 provides a zone wherein a quantity of di-para-xylylene dimer is initially vaporized at elevated temperatures. Thereafter, the vaporized dimer is transferred via pipe 42 into the pyrolysis chamber 44 wherein the dimer is pyrolized at temperatures of about 400 to 750 degrees C. to form the desired para-xylylene monomer. Following pyrolysis, the reactive monomer vapor is transferred via line 46 into the novel parylene deposition chamber entering tangentially near the top of the chamber. Such tangential entry creates a rotary vapor flow pattern within the chamber.

A substrate holding fixture is positioned within the center of the chamber and, in this preferred embodiment, is rotated in a direction opposite to the rotational direction of the vapor flow by fixture drive means 47.

Following deposition and condensation of the coating on the substrates contained within the deposition chamber 20, any residual vapor will exit the bottom of the deposition chamber 20 via exit line 32. The cold trap 48 serves to rapidly condense and polymerize such residual vapors. Vacuum pump 50 is connected to the entire system via vacuum line 52 and maintains continual negative pressure on the system.

The ability of the present invention to uniformly and evenly deposit even ultra thin parylene coatings is owed in part to the specific configuration and mode of operation of a novel substrate holding fixture which is positionable within the deposition chamber 20. The specific functional features of such substrate holding feature are shown in FIG. 3. Specifically, the substrate holding fixture 50 comprises two circular plate-like end panels 52 and 54 with a plurality of vertical support members 56, 58, 60 and 62 extending therebetween. One or more perforated substrates holding shelves 64 are horizontally connected within the vertical support members 56, 58, 60, and 62 so as to provide convenient shelves for stacking the desired substrates to be coated. In this preferred embodiment, the desired substrates may include such items as circuit boards, thermistors, sensors, probes, transducers, and similar devices.

The overall diameter of the end plates 52 and 54 will be less than the inside diameter of the chamber 20. Also, the substrate shelves 64 positioned between the end plates 52 and 54 will be diametrically equal to or smaller than such end plates. Thus, when the fixture 50 is disposed centrally within the cylinder 20, there will remain an open annular space 70 between the inner cylinder wall 24 and the outer circumference of the fixture 50. Such annular space 70 is particularly important in permitting the desired rotational or spiral flow of the descending vapors within the chamber 20 as will be more particularly described herein.

The fixture 50 is connected at its base to a rotatable fixture 66 which is located at the center of the tank floor 68. By such arrangement, the substrate holding fixture 50 may be slowly rotated, preferably in a direction counter to the rotational flow of the entering vapor.

The desired positioning of the fixture is maintained not only by the bottom pivotal connection to the rotatable mounting fixture 66, but also by a top pivotal member 7 which extends from the center of the upper plate member 52 and inserts within a locator notch 29 at the center of the hinged lid 28. By such arrangement, the substrate holding fixture 50 is firmly held in its central position within the chamber such that the annular space 70 around the fixture 50 is maintained.

As is specifically shown in FIG. 4 by the dotted arrows, the reactive monomer vapor enters tangentially at the top of the cylinder through vapor entry line 46. The vapor thereafter flows rotationally in a first direction (i.e. clockwise) around the annular space 70 and is pulled axially downward by vacuum existing at outlet port 34 so as to infiltrate all open areas within the substrate holding fixture 50.

In the showing of FIG. 4, the fixture 50 is being slowly rotated in a counter-clockwise direction as indicated by arrow X. Such counter-clockwise rotation of the fixture is opposite to the rotational flow of the incoming vapor. Such gives rise to uniform dispersion of the vapor as it condenses and polymerizes on the substrate surfaces.

Although the invention has been described herein with respect to a preferred embodiment, numerous modifications and alterations may be made to the described embodiment without departing from the spirit and intended scope of the invention. For instance, the shape, orientation and/or positioning of the deposition chamber may be altered in many ways without preventing or interfering with the intended rotational flow of vapors within the chamber. Also, the substrate holding fixture may be configured in many different ways while still retaining its desired functional capacity.

Accordingly, it is intended to include any and all such modifications and alterations within the scope of the following claims and/or the equivalents thereof.

What is claimed is:

1. A parylene deposition system comprising:
    a pyrolytic vapor generating module comprising:
        a vaporization chamber for vaporizing a quantity of di-para-xylylene dimer; and
        a pyrolysis chamber connected to said vaporization chamber, wherein said vaporized dimer may be pyrolized to form a reactive monomer vapor; and
    a deposition chamber module comprising:
        a closed tank having a lid movable between a first open position and a second closed position, said deposition chamber module including a vapor inlet port and outlet port formed upon said tank and positioned to provide a flow path for the reactive monomer vapor through said tank, said inlet port being disposed upon said tank such that the reactive monomer vapor will enter the tank tangentially, and will thereafter flow in a generally rotational path about the interior of the tank toward said outlet port;
        a substrate support fixture positioned within said tank; and
        means for selectively attaching and detaching said deposition chamber module to said pyrolytic vapor generating module.

2. The modular parylene deposition system of claim 1 wherein the deposition chamber module includes a cold trap and a vacuum pump, said vacuum pump being operative to maintain continual negative pressure within the tank and pull said vapor downward through said tank toward said outlet port thereby infiltrating all areas within the substrate support fixture.

* * * * *